United States Patent
Wang et al.

(10) Patent No.: US 6,842,081 B2
(45) Date of Patent: Jan. 11, 2005

(54) DUAL FREQUENCY VOLTAGE CONTROLLED OSCILLATOR CIRCUIT

(75) Inventors: Xudong Wang, Groton, MA (US); Xiaodong Wang, Acton, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/163,003

(22) Filed: Jun. 6, 2002

(65) Prior Publication Data

US 2003/0228849 A1 Dec. 11, 2003

(51) Int. Cl.$^7$ ................................................. H03B 5/00
(52) U.S. Cl. ............................... 331/117 R; 331/177 V
(58) Field of Search ........................... 331/177 V, 182, 331/183, 117 R, 108 B, 105, 36 C, 175, 115, 108 C, 117 V, 167, 113 R, 111

(56) References Cited

U.S. PATENT DOCUMENTS

| | | | |
|---|---|---|---|
| 5,231,361 A | | 7/1993 | Smith et al. ................... 331/56 |
| 5,629,652 A | * | 5/1997 | Weiss ...................... 331/108 B |
| 6,046,647 A | * | 4/2000 | Nelson ......................... 331/105 |
| 6,127,900 A | | 10/2000 | Laub et al. ................... 331/179 |
| 6,137,372 A | | 10/2000 | Welland ................... 331/117 R |
| 6,147,567 A | | 11/2000 | Welland et al. ............. 331/179 |
| 6,150,891 A | | 11/2000 | Welland et al. ................ 331/25 |
| 6,445,257 B1 | * | 9/2002 | Cox et al. ............... 331/117 R |
| 6,469,587 B2 | * | 10/2002 | Scoggins ................ 331/117 R |
| 6,545,555 B1 | * | 4/2003 | Justice et al. ........... 331/117 R |

OTHER PUBLICATIONS

A Filtering Technique To Lower LC Oscillator Phase Noise, IEEE Journal of Solid–State Circuits, Emad Hegazi et al. vol. 36, No. 12, Dec. 2001 pp. 1921–1930.
Tail Current Noise Suppression In RF CMOS VCOs IEEE Journal of Solid–State Circuits, Pietro Andreani et al. vol. 37, No. 3, Mar. 2002, pp. 342–348.
A Low Phase Noise Monolithic VCO In SiGe BiCMOS, IEEE Radio Frequency Integrated Circuits Symposium, Jean–Marc Mourant et al. 2000, pp. 65–68.

* cited by examiner

Primary Examiner—Minh Nguyen
(74) Attorney, Agent, or Firm—George R. Pettit; Joseph P. Abate

(57) ABSTRACT

An oscillator for generating a fundamental frequency signal and harmonic signal to provide multiple radio frequency signals. First and second bipolar transistors are differentially connected, and have base and collector terminals cross-coupled. A pair of inductors serially connect the collectors of the transistors to one terminal of a d.c. power supply source. A current source connects to the other terminal of the d.c. power supply source and to the emitters of the differentially connected transistor. A tuning capacitor connected between collector terminals establishes a resonant frequency for the oscillator. Crosscoupling is affected at a level that produces harmonic signals which can be used along with a fundamental frequency signal in numerous radio telecommunications applications.

8 Claims, 3 Drawing Sheets

DUAL FREQUENCY VOLTAGE CONTROLLED OSCILLATOR CIRCUIT

BACKGROUND OF INVENTION

The present invention relates to high frequency telecommunications applications. Specifically, a voltage controlled oscillator (VCO) which may be used in a digital telephone for generating multiple bands of radio frequency signals and intermediate frequency signals is disclosed.

Voltage controlled oscillators are used for multiple purposes in the radio telecommunications industry. Specifically, in cellular telephone applications, voltage controlled oscillators are used to established a channel frequency within one or two bands according to the GSM digital telephone standard. The two frequency bands employed in the GSM standard are 850 to 900 MHZ, and 1800 to 1900 MHZ. In order to provide local oscillator signals, as well as transmit carriers, tunable voltage controlled oscillators are implemented in a frequency synthesizer application.

Local oscillator signals are usually generated with the same signal source used for generating a transmit frequency. In both applications, it is necessary to maintain the signal phase noise below a level which would otherwise increase the noise floor and limit the range of the cellular telephone. In one conventional voltage controlled oscillator design, a pair of bipolar transistors are utilized in a cross-coupled differential configuration having a current source connected to the emitter connections. A resonant collector circuit is digitally and analog tuned to control the oscillation frequency. Phase noise in the output signal is produced by the harmonic content of the signal produced by the current source which is re-modulated in the resonant collector circuit. In some of these applications, it is therefore desirable to suppress the harmonic content generated by the current sources.

In other applications of the voltage controlled oscillator, the presence of phase noise is not as critical. For instance, in quadrature phase modulation and demodulation systems, which use a lower intermediate frequency, phase noise is significantly less of a problem. The I and Q signals of a quadrature system are generated from a second harmonic signal using CML, or ECL logic, which is then divided by two, or by four, with a digital counter to produce symmetrical I and Q signals.

The present invention is directed to a voltage controlled oscillator which will perform in applications where phase noise is a critical design parameter or where phase noise is a lesser concern.

SUMMARY OF THE INVENTION

A dual band voltage controlled oscillator is provided wherein first and second bipolar transistors have collector connections cross-coupled to the base connection of the other transistor. A common current source supplies current to the emitters of the first and second transistors. A tuned parallel resonant circuit comprises inductors connecting the collectors to a power supply terminal and a tuning capacitor to establish a resonant frequency for the tuned oscillator.

The circuit has sufficient coupling between the collector and bases of the bipolar transistors to generate harmonic signals across the current source. The harmonic signals may be advantageously coupled to further circuitry to provide, for instance, a tunable second harmonic signal which can be used along with a fundamental frequency signal derived from the collectors of the bipolar transistors. By controlling the amount of cross-coupling, a trade off between harmonic amplitude and phase noise for the voltage controlled oscillator may be made depending on the specific application.

The circuit may be provided with adjustable feedback, so that the trade off between harmonic content and phase noise can be appropriately made. Where the voltage controlled oscillator is used in an application requiring only the fundamental frequency signal, a further harmonic control circuit may be employed to suppress the harmonic frequency signals.

DESCRIPTION OF PREFERRED EMBODIMENTS

Figure 1:
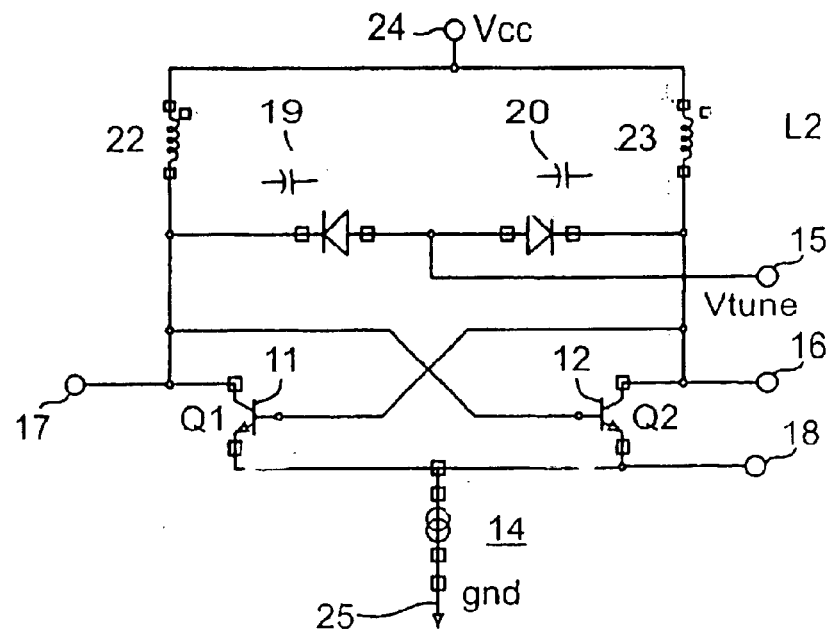
FIG. 1 illustrates a cross-coupled bipolar transistor VCO which provides for a fundamental frequency signal and second harmonic frequency signal.

Referring now to FIG. 1, a dual output frequency voltage control oscillator (VCO) is shown. The circuit employs two bipolar transistors 11 and 12, which have collector connections cross-coupled to the base connection of the opposite transistor. Current for the bipolar transistors 11 and 12 is generated by the current source 14 having one terminal connected to the common ground terminal 25.

The frequency of operation for the circuit is established by the series inductors 22, 23, and the tunable capacitors, shown as varactors diodes 19 and 20 varactors diodes 19 and 20 are connected back-to-back, and are tuned by a common tuning voltage applied to terminal 15. The tuning voltage establishes the capacitance of varactor diodes of 19 and 20 which establishes the resonant frequency formed by the parallel resonant circuit comprising varactor diodes 19, 20 and inductors 22, 23.

A circuit in accordance with FIG. 1 can be operated to produce a resonant frequency signal in the 800 to 900 MHZ range for The GSM cellular telephone band application. Additionally, in those applications where low phase noise is not required, a second output signal, which is a harmonic of the VCO fundamental frequency of operation, may be obtained from terminal 18.

Figure 5:
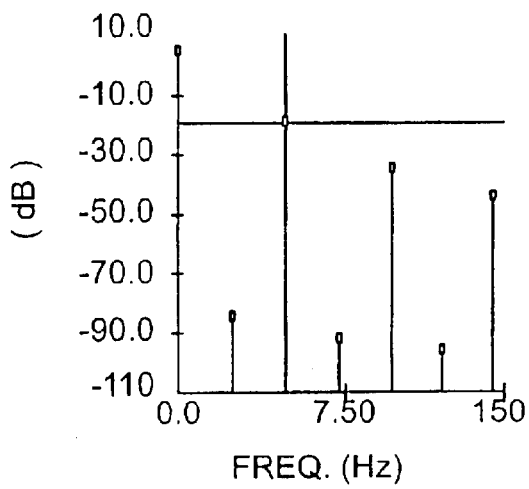
FIG. 5 illustrates the fundamental frequency spectrum produced by the circuit of FIG. 1.
Figure 4A:
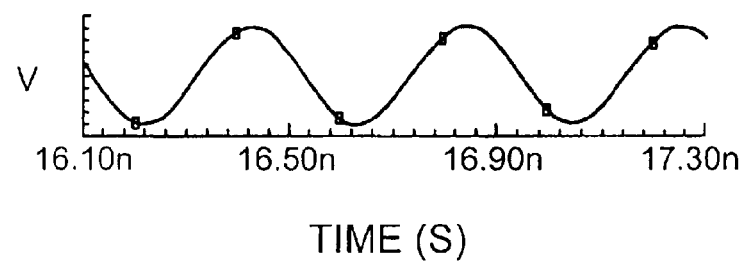
FIG. 4A illustrates the fundamental frequency signals generated by the circuit of FIG. 1.
Figure 4B:
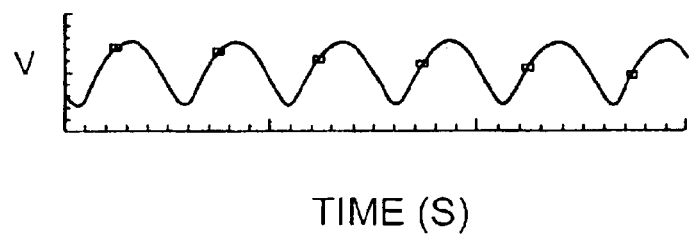
FIG. 4B illustrates harmonic signals generated by the circuit of FIG. 1.

As shown in FIGS. 4A and 4B, a fundamental frequency signal in the frequency range of 800 to 950 MHZ is available from the collectors of transistors 10, 11, on terminal 16, and a high amplitude second harmonic signal in the frequency range of 1600 MHZ to 1900 MHZ is available at terminal 18. Accordingly, the circuit may be used in those applications where an I and Q signal is developed by dividing a frequency multiplied signal available at terminal 18. FIG. 5 shows the frequency spectrum of the signal available at terminal 18. The second harmonic signal is especially prominent, and may be used for such applications as generating I and Q signals by dividing a multiplied signal using a digital divider circuit.

Figure 6:
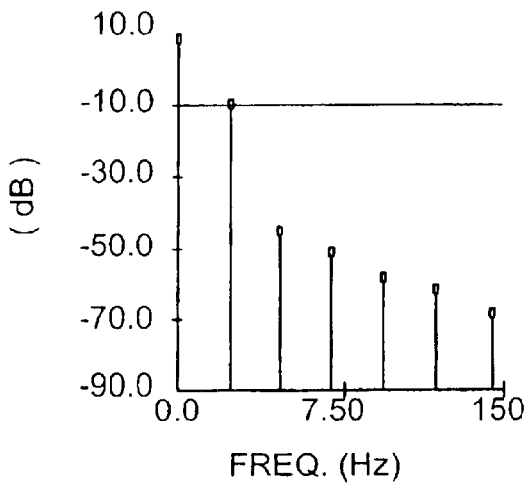
FIG. 6 illustrates the harmonic frequency spectrum produced at the harmonic frequency by the circuit of FIG. 1.

FIG. 6 illustrates the frequency content of a fundamental frequency signal derived from either single ended terminal 16 or differentially from terminal 16 and 17. Since all harmonic signals are located at least 40 db down from the fundamental frequency signal, the fundamental frequency signal can be considered to be relatively free of harmonic signal content.

Figure 2:
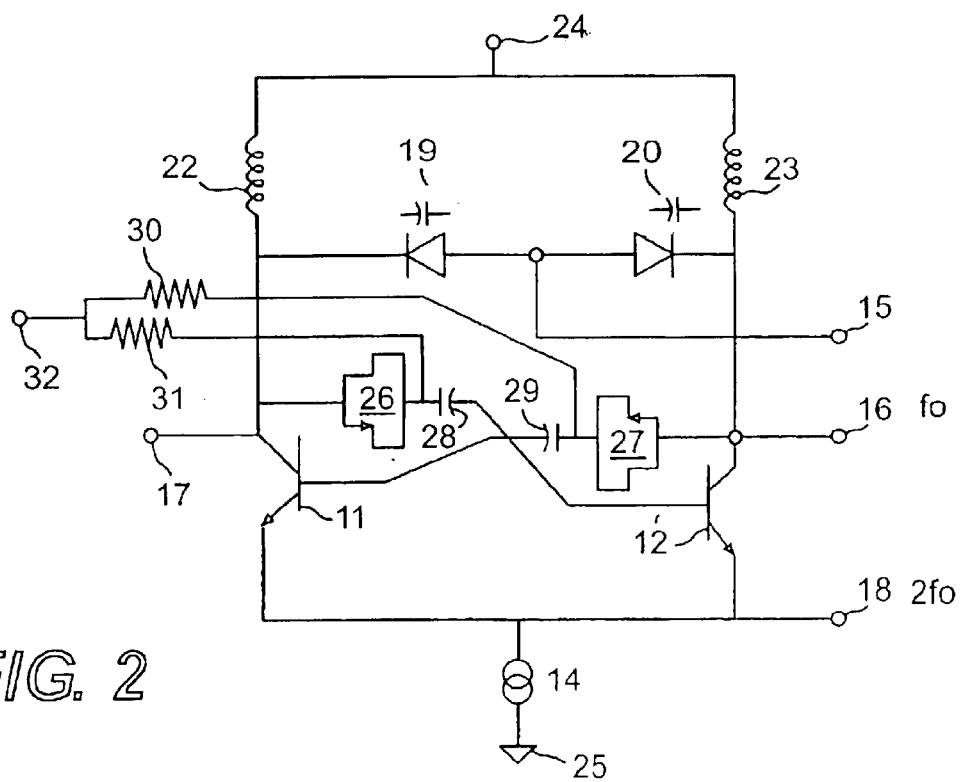
FIG. 2 illustrates an embodiment of the invention wherein the amount of cross-coupling between bipolar transistors is controlled to control the level of second harmonic signal.

The magnitude of the harmonic frequency signal can be controlled by controlling the coupling between collectors and bases of the opposite transistors of the differential pair of transistors 11, 12. Referring now to FIG. 2, MOSFETS 26, 27 provide capacitive cross-coupling between collectors and bases of opposite differentially connected transistors 11, 12. The remaining components of FIG. 2 are identical to the components of FIG. 1 and are identified by identical components numbers.

MOSFETS 26, 27 have gate connections connected to the collector of transistors 11, 12, and source and drain connections connected to DC blocking capacitors 28, 29, respectively. A bias potential is applied from feedback control terminal 32 through resistors 30, 31 to the gates of transistors 26, 27. The amount of capacitance coupling between the base and collector connections of opposite transistors is controlled by the voltage applied to the feedback control terminal 32. When the feedback control terminal 32 is at the lower voltage, each of the MOSFETS 26, 27 are in a depletion mode, and the capacitance of MOSFETS 26, 27 is a function of the gate oxide capacitance for each of the devices.

The capacity exhibited by each of the MOSFETS 26 and 27 is lowered, providing less coupling between base and collector connections when a higher potential is applied to the feedback control terminal 32. In this instance, the gate oxide capacitance and substrate capacitance are a serially connected together, lowering the overall capacitive coupling between transistors 11 and 12.

The embodiment of FIG. 2 permits selective control over the amount of feedback, and, therefore, the amount of harmonic signals generated at terminal 18. The generation of harmonic signals at terminal 18 will necessarily increase the phase noise for signals at the fundamental frequency of the VCO circuit produced at terminal 16. In applications where less harmonic signal is required from terminal 18, the feedback control voltage applied to terminal 32 may be used to decrease the feedback voltage and lower the amplitude of the harmonic signals appearing at terminal 18 in favor of a fundamental frequency signal on terminal 16 having lower phase noise.

Figure 3:
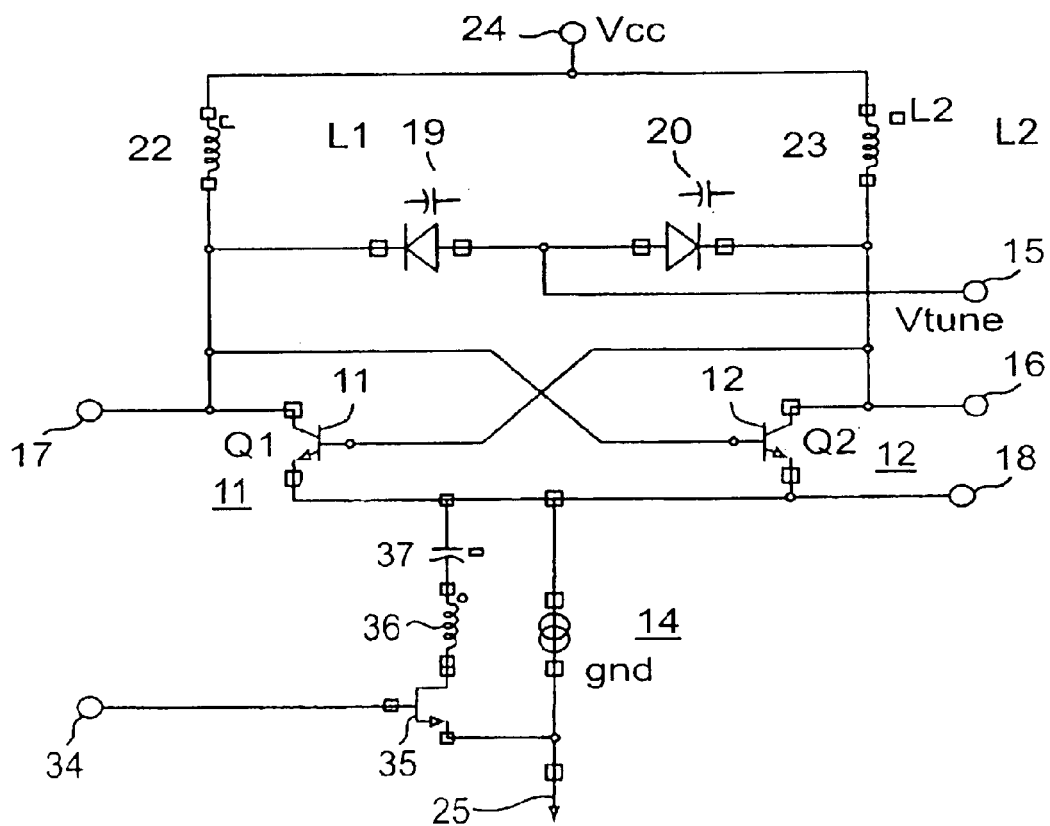
FIG. 3 illustrates another embodiment of the invention in which the second harmonic frequency signal is suppressed for reducing phase noise of the system.

The foregoing principles may be used with even further control of the harmonic signal level in the embodiment according to FIG. 3. Referring now to FIG. 3, a voltage controlled oscillator of the general configuration as previously described is shown. Components which are common to the circuits of FIGS. 1–3 are identified by the same reference numeral.

Control terminal 34 is provided to permit suppression of harmonic signals appearing at the terminal 18. In this way, when the fundamental frequency signal phase noise is to be maintained at a minimal level, the harmonic signals appearing across the current source 15 can be suppressed using a series resonant filter trap. The filter trap comprises a capacitor 37 and inductor 36 serially resonant at a harmonic frequency such as the second harmonic of the VCO. MOSFET 35, when enabled by the signal appearing on terminal 34, connects the trap across the current source 14 and suppresses signals falling within the bandwidth of the filter trap. As the second harmonic is typically the major harmonic component appearing at terminal 18 in accordance with the embodiment of FIG. 3, the filter trap components 36, 37 have values selected to provide series resonance at the second harmonic frequency.

Thus, there is disclosed a circuit that is capable of generating a fundamental frequency signal from terminal 16, as well as harmonic frequency signals from terminal 18.

The foregoing description of the invention illustrates and describes the present invention. Additionally, the disclosure shows and describes only the preferred embodiments of the invention in the context of a voltage controlled oscillator, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

What is claimed:

1. A dual band voltage controlled oscillator comprising:

first and second bipolar transistors, each transistor having a collector cross coupled to a base of the other transistor;

a common current source connected to supply to emitters of said first and second transistors an operating current;

a pair of inductors serially connected between each of said collectors and a power supply terminal;

tuning capacitor means connected between each of said collectors for forming a resonant circuit which said inductors at a resonant frequency;

a first output terminal connected to one of said collectors to produce a signal having a frequency equal to said resonant frequency;

a second output terminal connected to said emitter terminals for producing a harmonic signal which is a multiple of the frequency of said resonant frequency produced by said current source and means for controlling the amount of coupling between said collectors and base connections whereby the level of the harmonic signal is controlled.

2. The circuit according to claim 1 wherein the means for controlling the amount of coupling comprises first and second digital devices serially connecting a respective base of each bipolar transistor to a collector of an opposite transistor.

3. The circuit according to claim 2 wherein said digital devices comprise first and second field effect transistors having source and drain connections connected to a respective base of said bipolar transistors, and a gate connection connected to a respective collector connection of an opposite transistor, and first and second resistors connected to each of said field effect transistor drain and source connections for applying a voltage for operating said transistors.

4. The circuit according to claim 1 wherein said tuning capacitor means comprises first and second varactor diodes serially connecting said bipolar transistor collectors, and connected to receive a tuning voltage for continuously varying the frequency of oscillation of said circuit.

5. The circuit according to claim 1 wherein said resonant frequency is substantially 900 MHZ and the harmonic frequency is at substantially 1800 MHZ.

6. A dual band voltage controlled oscillator comprising:
   first and second bipolar transistors, each transistor having a collector cross coupled to a base of the other transistor;
   a common current source connected to supply to emitters of said first and second transistors an operating current;
   a pair of inductors serially connected between each of said collectors and a power supply terminal;
   tuning capacitor means connected between each of said collectors for forming a resonant circuit with said inductors at a resonant frequency;
   a first output terminal connected to one of said collectors to produce a signal having a frequency equal to said resonant frequency;
   a second output terminal connected to said emitter terminals for producing a harmonic signal which is a multiple of the frequency of said resonant frequency produced by said current source;
   a series resonance filter having a series resonant frequency which is the second harmonic of said first output terminal signal connected at one end to one end of said current source; and
   a resistance element connecting a second end of said series resonant filter to a second end of said current source.

7. The circuit according to claim 6 wherein said resistance element is a field effect transistor connected to receive a control voltage on a gate thereof and to change the amount of current flowing through said series resonant filter.

8. The circuit according to claim 6 wherein said series resonant frequency is 1800 mhz.

* * * * *